United States Patent
Chu et al.

(10) Patent No.: US 6,743,735 B2
(45) Date of Patent: Jun. 1, 2004

(54) PHOTORESIST REMOVAL FROM ALIGNMENT MARKS THROUGH WAFER EDGE EXPOSURE

(75) Inventors: Po-Tao Chu, Tainan (TW); Hsin-Yuan Chen, Tainan (TW); Chung-Jen Chen, Tainan (TW); Tai-Ming Yang, Tainan (TW); Cheng-Ming Wu, Tainan (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 10/102,288

(22) Filed: Mar. 19, 2002

(65) Prior Publication Data

US 2003/0181058 A1 Sep. 25, 2003

(51) Int. Cl.[7] .............................................. H01L 21/302
(52) U.S. Cl. ........................ 438/738; 438/462; 438/737; 438/906
(58) Field of Search ................................ 438/462, 737, 438/738, 906

(56) References Cited

U.S. PATENT DOCUMENTS

| | | | | |
|---|---|---|---|---|
| 5,271,798 A | * | 12/1993 | Sandhu et al. | 438/745 |
| 5,656,229 A | * | 8/1997 | Tanimoto et al. | 264/400 |
| 6,057,206 A | * | 5/2000 | Nguyen et al. | 438/401 |
| 6,306,560 B1 | * | 10/2001 | Wang et al. | 430/316 |
| 6,326,231 B1 | * | 12/2001 | Subramanian et al. | 438/72 |
| 6,492,269 B1 | * | 12/2002 | Liu et al. | 438/687 |

* cited by examiner

Primary Examiner—Richard Elms
Assistant Examiner—Christian D. Wilson
(74) Attorney, Agent, or Firm—Tung & Associates

(57) ABSTRACT

Removing photoresist from alignment marks on a semiconductor wafer using a wafer edge exposure process is disclosed. The alignment marks on the wafer are covered by photoresist used in conjunction with semiconductor processing of one or more layers deposited on the semiconductor wafer. One or more parts of the edge of the wafer are exposed to remove the photoresist from these parts and thus reveal alignment marks on the wafer. The exposure of the one or more parts of the wafer is accomplished without performing a photolithographic clear out process. Rather, a wafer edge exposure (WEE) process is inventively utilized. Once the WEE process is performed, subsequent layers may be deposited by aligning them using the revealed alignment marks.

16 Claims, 8 Drawing Sheets

PHOTORESIST REMOVAL FROM ALIGNMENT MARKS THROUGH WAFER EDGE EXPOSURE

FIELD OF THE INVENTION

This invention relates generally to photoresist removal from alignment marks in semiconductor processing, and more specifically to such removal through wafer edge exposure.

BACKGROUND OF THE INVENTION

Deposition and patterning are two of the basic steps performed in semiconductor processing. Patterning is also referred to as photolithography, masking, oxide or metal removal, and microlithography. Patterning enables the selective removal of material deposited on a semiconductor substrate, or wafer, as a result of deposition. For example, as shown in FIG. 1A, a layer 104 has been deposited on a substrate 102. After the photolithography process is performed, as shown in FIG. 1B, some parts of the layer 104 have been selectively removed, such that gaps 106a and 106b are present within the layer 104. A photomask, or pattern, is used (not shown in FIG. 1B) so that only the material from the gaps 106a and 106b are removed, and not the other portions of the layer 104. The process of adding layers and removing selective parts of them, in conjunction with other processes, permits the fabrication of semiconductor devices.

Alignment is critical in photolithography and deposition, as well as in other semiconductor processes. If layers are not deposited properly, or if they are not selectively removed properly, the resulting semiconductor devices may not function, relegating them to scrap, which can be costly. Therefore, alignment marks are placed on the semiconductor wafer for the proper positioning during the deposition and photolithography processes. This is shown in FIG. 2, where the semiconductor wafer 202 has alignment marks, such as the alignment square 204, thereon. When the photomask 206 is positioned over the wafer 202, its own alignment marks, such as the alignment square 208, is aligned with the alignment marks of the wafer 202. For example, the alignment square 208 of the photomask 206 is aligned so that the alignment square 204 of the wafer 202 is centered therein.

Alignment is especially critical where more a number of metal or other layers have already been deposited on the wafer. Subsequent deposition of silicon dioxide or other layers in such instances usually requires that the alignment marks on the wafer be exposed for proper overlay of the silicon dioxide or other layers. While a mask may prevent the layers themselves from obfuscating the alignment marks, the photoresist used to pattern or perform other processing of these layers cannot be masked, and covers or at least blurs the alignment marks. Without clear exposure of the alignment marks, however, overlay misalignment can result. Overlay misalignment is also referred to as overlay registration error. Misalignment is a serious problem, and can result in significant semiconductor wafer scrap. Wafer scrap can sometimes be reused, but often is discarded, resulting in added costs incurred by the semiconductor foundry.

The conventional approach to exposing photoresist-obfuscated alignment marks on the wafer after a number of layers have been deposited on the wafer is to use a photolithographic clear out process. This process is also referred to as the clear out window process. A general description of the effects of the clear out process is described with reference to FIGS. 3A and 3B. As shown in FIG. 3A, the alignment marks 304 are hidden from view by the photoresist 302 that have been deposited on the silicon wafer, and are indicated as such as dotted. To maintain the alignment marks 304, a photolithographic clear out process is performed, which clears the photoresist 302 from around the alignment marks 304. The results of the clear out process are shown in FIG. 3B, where a window 306 has been created around the alignment marks 304, exposing the underlying silicon wafer.

FIGS. 4A and 4B show how the clear out process can generally be performed. In FIG. 4A, a mask 402 is shown that contains an auxiliary pattern 402. The mask 402 can also be a reticle. The auxiliary pattern 402 contains no device circuitry, and surrounds a smaller pattern 405 in order to clear out a specified window area and isolate the smaller pattern 405. In this case, the auxiliary pattern 402 would correspond to the alignment marks 304 of FIG. 3B, such that a part of the photoresist 302 remains surrounded by the alignment marks 304 as shown in FIG. 3B. By comparison, in FIG. 4B, a mask 406 is shown that contains a blank pattern 408, where the mask 406 may also be a reticle. The blank pattern 408 contains no circuitry, and clears out a specified window area, such that no part of the resist 302 of FIG. 3B would remain surrounded by the alignment marks 304 if the blank pattern 408 were used in lieu of the auxiliary pattern 402 of FIG. 4A.

A more specific manner by which alignment marks are exposed using a conventional clear out process is shown by reference to FIG. 5. The wafer 502 has a number of deposition layers, such that the surface of the wafer 502, with its alignment marks thereon, is not visible. Specifically, the alignment marks are obfuscated or blurred by the photoresist that was applied during patterning or other processing of the deposition layers. Two alignment mark areas are exposed, a lower-left area 504, and an upper-right area 506. The alignment mark areas 504 and 506 are not drawn to scale, but rather are much larger than what is typical for purposes of illustrative clarity. Four clear-out windows are used to expose each of the areas 504 and 506. The clear-out windows 508a, 508b, 508c, and 508d expose the alignment marks within the area 504, whereas the clear-out windows 510a, 510b, 510c, and 510d expose the alignment marks within the area 506.

Employing a clear out window process to expose alignment marks so that subsequent silicon dioxide or other layers can be deposited without overlay registration error is, however, a time-consuming, and therefore costly, process. As demonstrated in conjunction with FIG. 5, at least eight exposure images may have to be taken to expose the alignment marks within just two alignment mark areas. Performing each particular clear out process generally takes at least two seconds, usually due to the time involved to change the reticle or mask size. This means that exposing the alignment marks requires at least eight seconds per silicon wafer, which can be an intolerable and costly delay in semiconductor manufacture. Further, exposure of the alignment marks within the alignment mark areas effectively reduces the usage area of the reticle or the mask.

Therefore, there is a need for exposing alignment marks within alignment mark areas without employing a conventional photolithographic clear out process. There is a need for such exposure without adding significant time and cost to the semiconductor manufacture process. Such exposure should desirably not reduce the effective usage area of the reticle or the mask. For these and other reasons, there is a need for the present invention.

SUMMARY OF THE INVENTION

The invention relates to removing photoresist from alignment marks on a semiconductor wafer through a wafer edge exposure process. The alignment marks on the wafer are covered by photoresist resulting from processing of one or more layers that have been deposited on the semiconductor wafer. To reveal the alignment marks, one or more parts of the edge of the wafer are exposed, removing the photoresist from these parts. The exposure of the one or more parts of the wafer is accomplished without performing a photolithographic clear out process. Rather, a wafer edge exposure (WEE) process is inventively utilized, as this process is designed to clean the edge of the wafer for optimized cleanliness of subsequent processes. Once the WEE process is performed, subsequent layers may be deposited by aligning them using the revealed alignment marks.

The invention provides for advantages over the prior art. Significantly, the WEE process used by the invention does not employ a conventional photolithographic clear out process, and therefore avoids the disadvantages that result from using the conventional process. For instance, the significant time and cost that may be added to the semiconductor manufacture process when using the photolithographic clear out process to expose alignment marks is avoided by the invention. The effective usage area of the reticle or the mask is further not reduced by the invention as it is by the conventional clear out process. Still other advantages, embodiments, and aspects of the invention will become apparent by reading the detailed description that follows, and by referencing the attached drawings.

DETAILED DESCRIPTION OF THE INVENTION

In the following detailed description of exemplary embodiments of the invention, reference is made to the accompanying drawings that form a part hereof, and in which is shown by way of illustration specific exemplary embodiments in which the invention may be practiced. These embodiments are described in sufficient detail to enable those skilled in the art to practice the invention. Other embodiments may be utilized, and logical, mechanical, and other changes may be made without departing from the spirit or scope of the present invention. The following detailed description is, therefore, not to be taken in a limiting sense, and the scope of the present invention is defined only by the appended claims.

Figure 6:
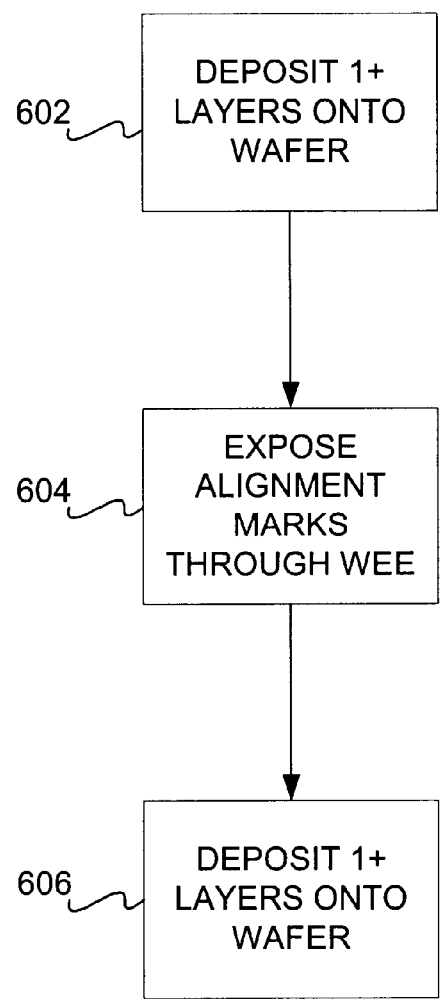
FIG. 6 is a flowchart of a method according to an embodiment of the invention.
Figure 6:
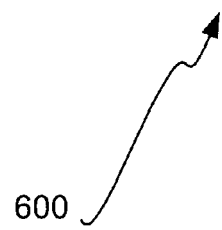

FIG. 6 shows a method 600 according to an embodiment of the invention. One or more layers are deposited on a silicon, or semiconductor, wafer having alignment marks in a number of areas on the wafer (602). The photoresist used in semiconductor process(es) of the deposited layers obfuscates or at least blurs the alignment marks, such that they are not usable for subsequent patterning or deposition. The layers that are deposited may be metal, silicon dioxide, or other types of layers.

Alignment marks in at least some parts of the edge of the wafer are revealed by exposing these parts of the wafer edge (604). That is, the photoresist that have been deposited on top of such alignment marks are removed at these parts of the edge of the wafer. Removal is accomplished without performing a conventional photolithographic process. Rather, a wafer edge exposure (WEE) system is preferably utilized to expose parts of the edge of the wafer to reveal the corresponding alignment marks.

The WEE system utilized may be one of those available from Silicon Tech Limited, of South Korea, or may be another type of WEE system. Furthermore, the WEE system may be used in conjunction with a track system, or track production line, that is designed to coat and develop patterns on a wafer. Such a track system is also available from Silicon Tech Limited, as well as from other manufacturers. The WEE process generally involves exposing specific area(s) of the edge of the wafer to ultraviolet light in controlled dosages. The WEE process is designed to allow for optimized cleanliness of the wafer in subsequent semiconductor processes, as opposed to the inventive use to which embodiments of the invention put the process.

After the alignment marks have been exposed, other semiconductor processes can then be performed using, or based on, the alignment marks to prevent overlay alignment or registration errors. For instance, one or more additional layers may be deposited on top of the other layers previously deposited on the wafer (606). Such layers may also be silicon dioxide, metal, or other types of layers. Therefore, embodiments of the invention utilize the WEE process to expose alignment marks at some parts of the edge of the wafer to prevent misalignment of subsequent processes. The processes that are performed before and after utilization of the WEE process can vary.

Figure 1A:
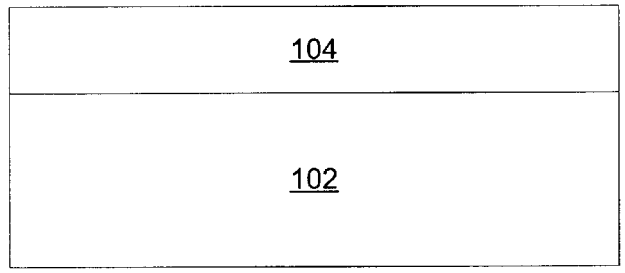
FIGS. 1A and 1B are diagrams showing the effect of patterning on a layer deposited on a semiconductor wafer.
Figure 1B:
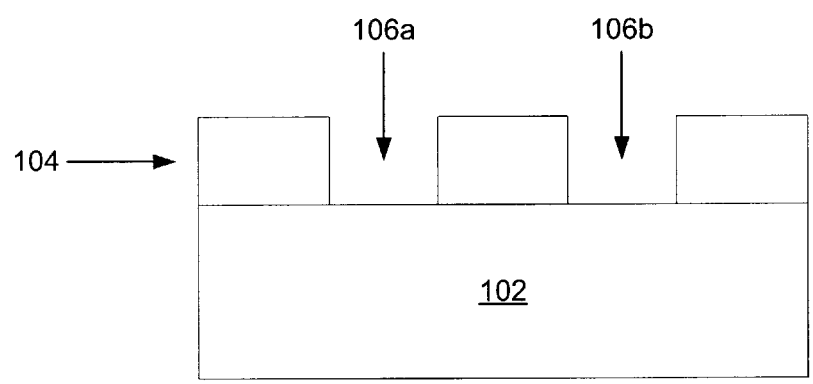
Figure 2:
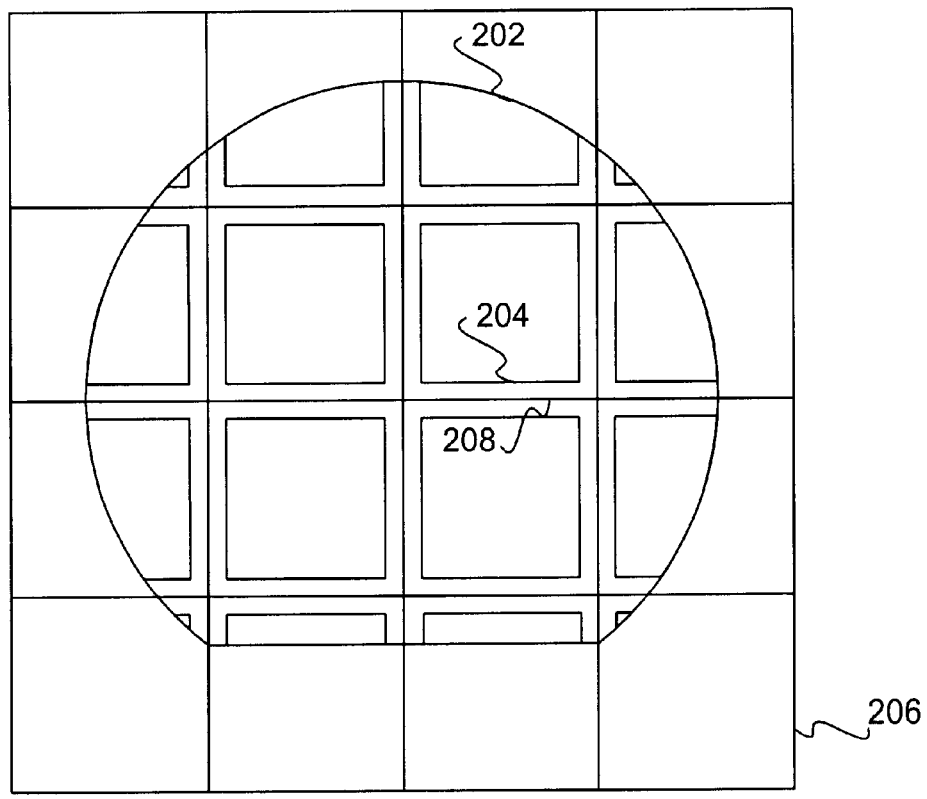
FIG. 2 is a diagram showing the alignment of a mask to a semiconductor wafer.
Figure 3A:
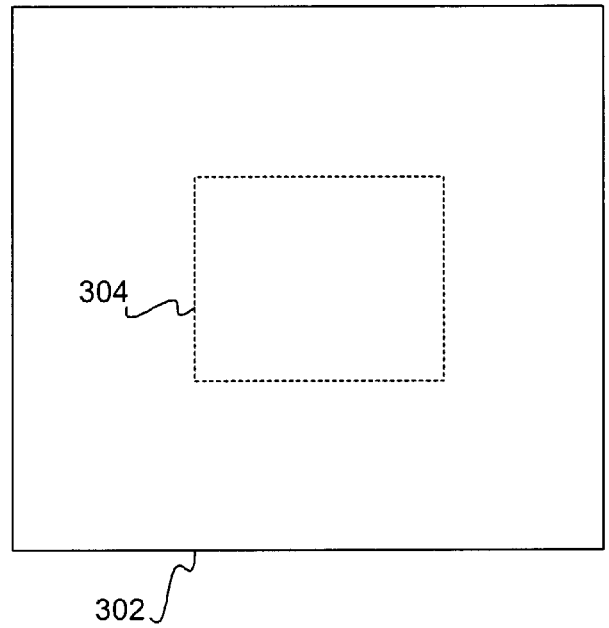
FIGS. 3A and 3B are diagrams showing the effects of a conventional clear out process.
Figure 3B:
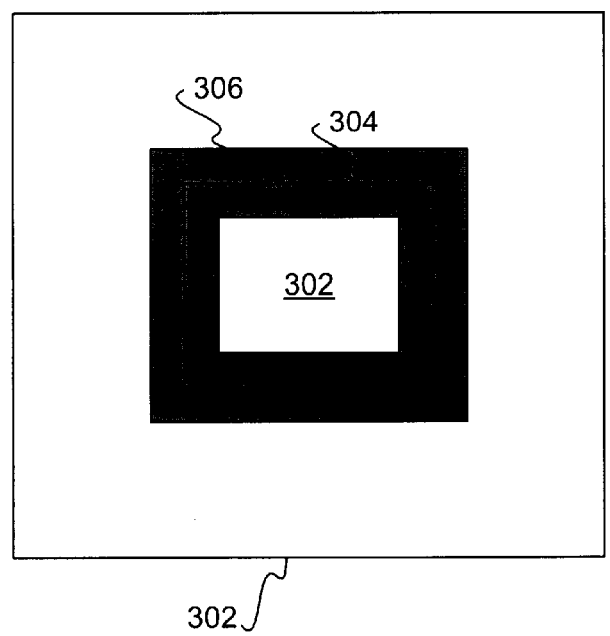
Figure 4A:
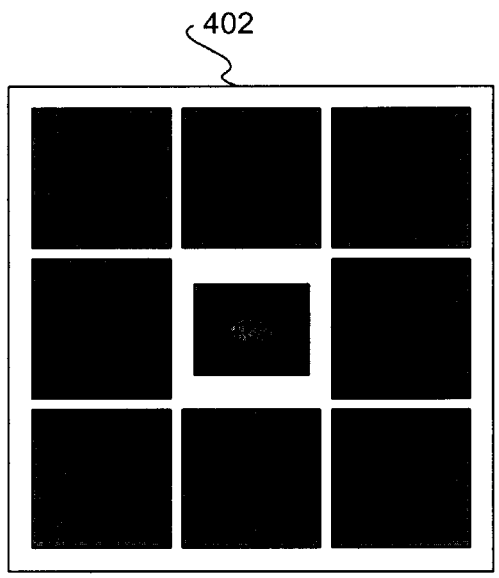
FIGS. 4A and 4B are diagrams showing how the conventional clear out process can generally be performed.
Figure 4B:
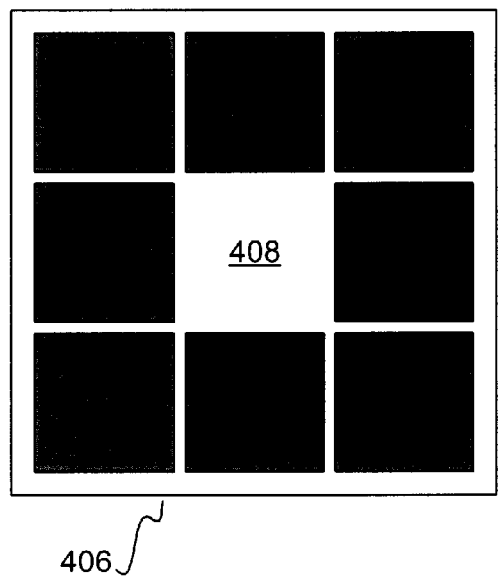
Figure 5:
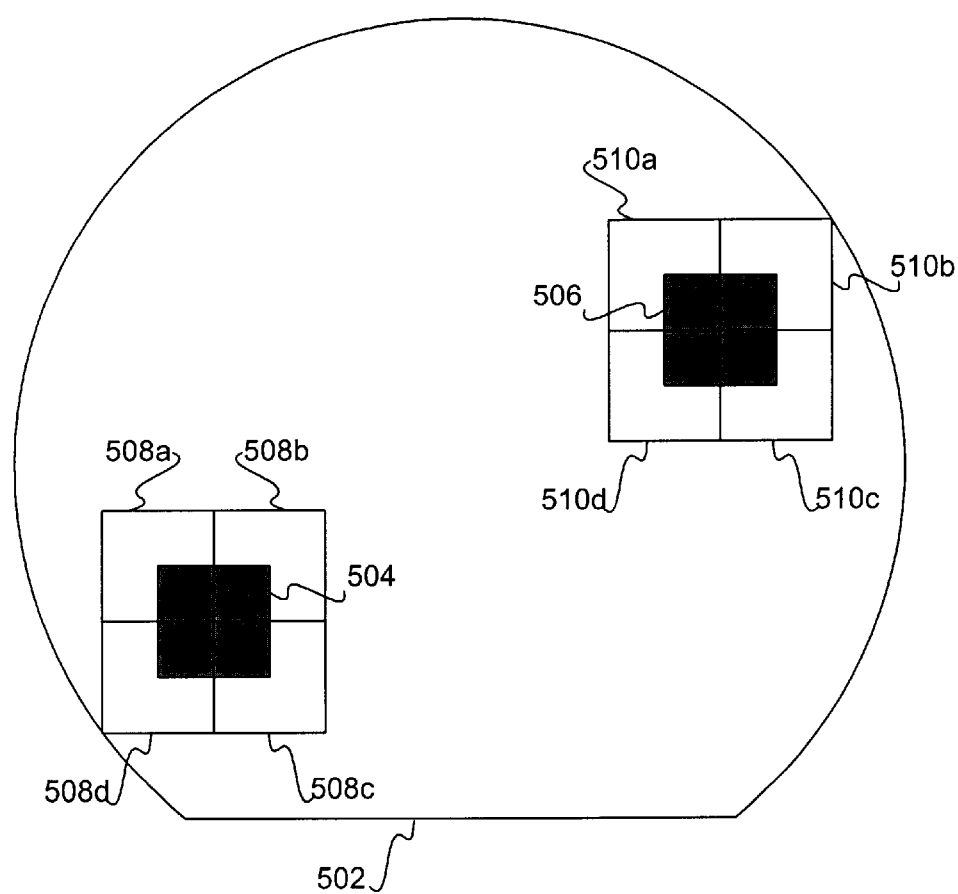
FIG. 5 is a diagram showing more specifically how alignment marks are exposed using a conventional clear out process.
Figure 7:
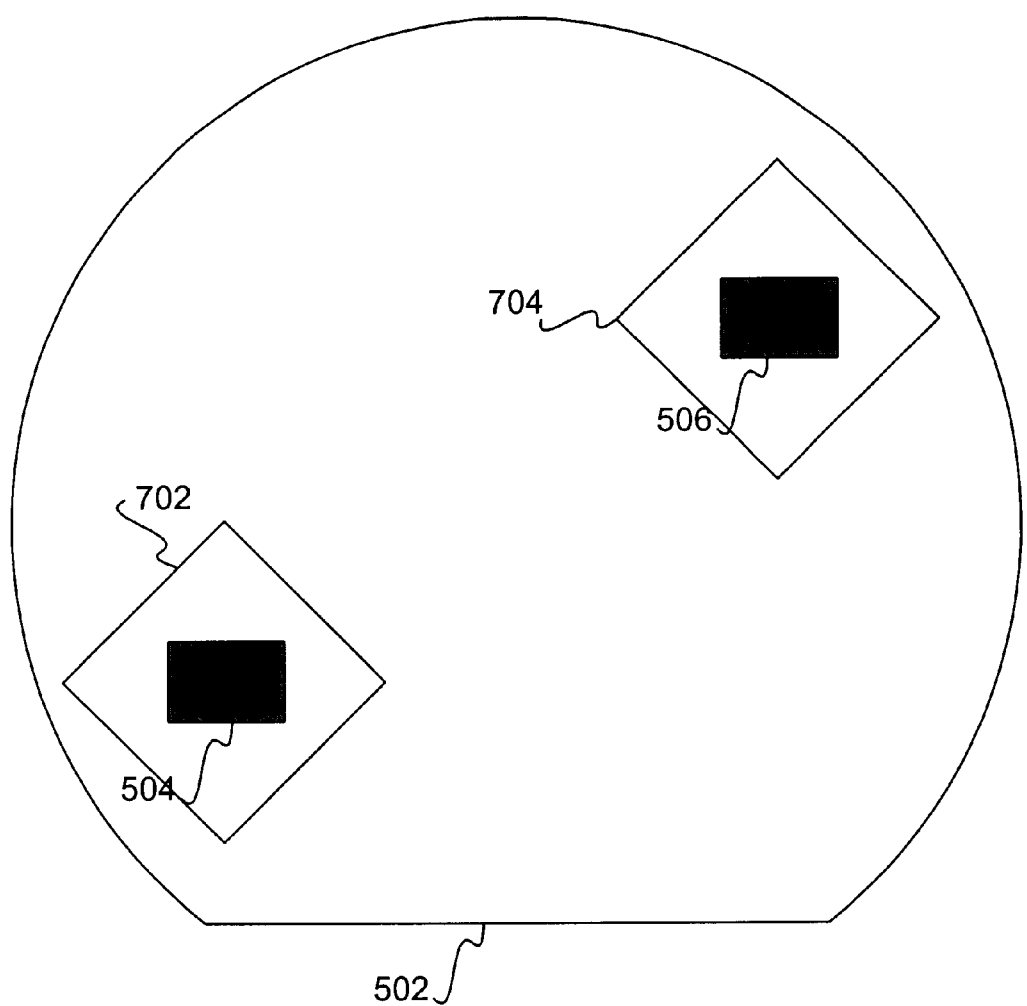
FIG. 7 is a diagram showing how alignment marks are exposed according to a wafer edge exposure (WEE) process of an embodiment the invention.

FIG. 7 shows how the silicon wafer 502 of FIG. 5 has its alignment mark areas 504 and 506 exposed to reveal the alignment marks contained within these areas according to an embodiment of the invention. The parts 702 and 704 lie at the edge of the wafer, and are exposed through the wafer edge exposure process. Because the alignment mark areas 504 and 506 lie within the edge parts 702 and 704, respectively, the alignment marks within the areas 504 and 506 are thus revealed. Where the WEE process is performed in conjunction with a track production line, the track may move in a circular or linear manner so that the WEE process is performed relative to the edge of the wafer 502. Alternatively, the WEE process may be performed only when the track moves relative to the WEE system such that first the lower-left alignment mark area 504 is exposed, and then the upper-right alignment mark area 506 is exposed, or vice-versa.

Figure 8:
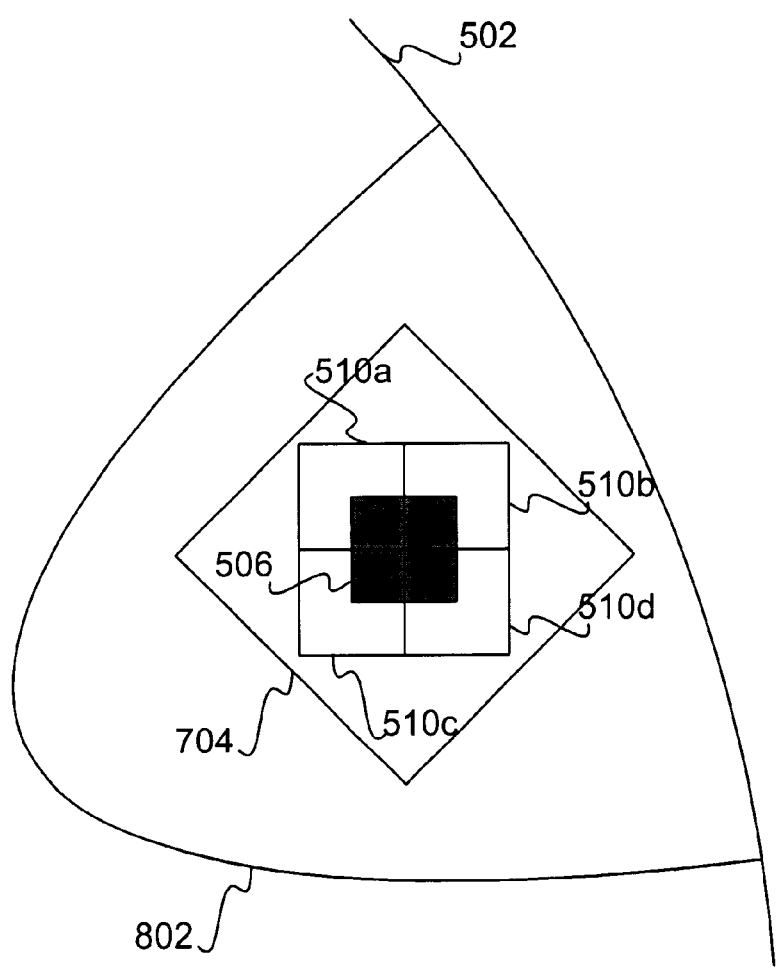
FIG. 8 is a diagram comparing how alignment marks are exposed according to the WEE process of an embodiment of the invention to how the marks are exposed according to the conventional clear out process.

FIG. 8 shows how employing the WEE process to reveal alignment marks compares to employing the conventional photolithographic clear out process in the prior art. Only part of the wafer 502 is shown for illustrative clarity. Whereas four clear out windows 510a, 510b, 510c, and 510d are necessary using the conventional clear out process to expose the alignment mark area 506, the WEE process of an embodiment of the invention is performed relative to a larger wafer edge part 704. Thus, the wafer edge part 704 subsumes, or contains, the clear out windows 510a, 510b, 510c, and 510d. An alignment mark shielding area 802 is also indicated in FIG. 8, and is preferably used to protect the alignment mark area 506 from metal or other layer deposition.

It is noted that, although specific embodiments have been illustrated and described herein, it will be appreciated by those of ordinary skill in the art that any arrangement is calculated to achieve the same purpose may be substituted for the specific embodiments shown. This application is intended to cover any adaptations or variations of the present invention. Therefore, it is manifestly intended that this invention be limited only by the claims and equivalents thereof.

What is claimed is:

1. A method comprising:

depositing one or more layers onto a semiconductor wafer having alignment marks on edges of the wafer; and, exposing the edges of the wafer both to clean the wafer for subsequent semiconductor processing and also to reveal the alignment marks on the edges of the wafer.

2. The method of claim 1, further comprising depositing one or more second layers on the semiconductor wafer, aligning the one or more second layers based on the alignment marks that are at the one or more parts of the edge of the wafer and that were revealed by exposing the one or more parts of the edge of the wafer.

3. The method of claim 2, wherein the one or more second layers comprise one or more of: a metal layer, a silicon dioxide layer, and a silicon layer.

4. The method of claim 1, wherein the one or more layers comprise one or more of: a metal layer, a silicon dioxide layer, and a silicon layer.

5. The method of claim 1, wherein exposing the one or more parts of the edge of the wafer comprises exposing a left part of the edge of the wafer and exposing a right part of the edge of the wafer.

6. The method of claim 1, wherein exposing the one or more parts of the edge of the wafer comprises exposing a lower-left part of the edge of the wafer and exposing an upper-right part of the edge of the wafer.

7. The method of claim 1, wherein exposing the one or more parts of the edge of the wafer comprises subjecting the one or more parts of the edge of the wafer to an ultraviolet light at a given dose.

8. The method of claim 1, wherein exposing the one or more parts of the edge of the wafer comprises utilizing a track production line.

9. A method comprising:

depositing one or more layers onto a semiconductor wafer having alignment marks on edges of the wafer; and, cleaning the edges of the wafer both to reveal the alignment marks on the edges of the wafer and also to prepare the wafer for subsequent semiconductor processing.

10. The method of claim 9, further comprising depositing one or more second layers on the semiconductor wafer, aligning the one or more second layers based on the alignment marks that are at the one or more parts of the edge of the wafer and from which the photoresist was removed.

11. The method of claim 9, wherein the one or more second layers comprise one or more of: a metal layer, a silicon dioxide layer, and a silicon layer.

12. The method of claim 9, wherein the one or more layers comprise one or more of a metal layer, a silicon dioxide layer, and a silicon layer.

13. A semiconductor device formed at least in part by a method comprising:

depositing one or more layers onto a semiconductor wafer having alignment marks at least at an edge of the wafer; and, removing photoresist used in conjunction with processing of the one or more layers from one or more parts of the edge of the wafer both to reveal the alignment marks that are at the one or more parts of the edge of the wafer and also to clean the wafer for subsequent semiconductor processing.

14. The device of claim 13, wherein the method further comprises depositing one or more second layers on the semiconductor wafer, aligning the one or more second layers based on the alignment marks that are at the one or more parts of the edge of the wafer and from which the potoresist was removed.

15. The device of claim 13, wherein removing the photoresist from the one or more parts of the edge of the wafer comprises exposing the one or more parts of the edge of the wafer.

16. The device of claim 15, wherein exposing the one or more parts of the edge of the wafer comprises subjecting the one or more parts of the edge of the wafer to an ultraviolet light at a given dose.

* * * * *